(12) United States Patent
Cave et al.

(10) Patent No.: US 11,481,801 B2
(45) Date of Patent: Oct. 25, 2022

(54) METHODS AND SYSTEMS TO MONITOR A MEDIA DEVICE VIA A USB PORT

(71) Applicant: The Nielsen Company (US), LLC, New York, NY (US)

(72) Inventors: Mark Cave, Palm Harbor, FL (US); Joseph Volpatti, New Port Richey, FL (US)

(73) Assignee: The Nielsen Company (US), LLC, New York, NY (US)

( * ) Notice: Subject to any disclaimer, the term of this patent is extended or adjusted under 35 U.S.C. 154(b) by 90 days.

(21) Appl. No.: 16/989,557

(22) Filed: Aug. 10, 2020

(65) Prior Publication Data

US 2021/0125218 A1 Apr. 29, 2021

Related U.S. Application Data

(63) Continuation of application No. 15/789,332, filed on Oct. 20, 2017, now Pat. No. 10,740,787, which is a continuation of application No. 13/328,927, filed on Dec. 16, 2011, now abandoned.

(51) Int. Cl.
| | |
|---|---|
| *G06F 13/42* | (2006.01) |
| *H04N 21/24* | (2011.01) |
| *G06Q 30/02* | (2012.01) |
| *G01R 19/165* | (2006.01) |
| *H04N 21/442* | (2011.01) |

(Continued)

(52) U.S. Cl.
CPC ... *G06Q 30/0246* (2013.01); *G01R 19/16576* (2013.01); *G06F 13/38* (2013.01); *G06F 13/4282* (2013.01); *G06Q 30/0241* (2013.01); *H04N 21/2407* (2013.01); *H04N 21/44222* (2013.01); *H04N 21/84* (2013.01); *G06F 2213/0042* (2013.01)

(58) Field of Classification Search
None
See application file for complete search history.

(56) References Cited

U.S. PATENT DOCUMENTS

| | | | |
|---|---|---|---|
| 4,766,491 | A | 8/1988 | Saitoh et al. |
| 4,956,825 | A | 9/1990 | Wilts et al. |
| 4,959,046 | A | 9/1990 | Brunetto et al. |

(Continued)

FOREIGN PATENT DOCUMENTS

EP 2011002 A2 * 1/2009 ............ H04H 60/29

OTHER PUBLICATIONS

United States Patent and Trademark Office, "Non-Final Office Action," dated Jul. 31, 2013 in connection with U.S. Appl. No. 13/328,927, 8 pages.

(Continued)

*Primary Examiner* — Michael Sun
(74) *Attorney, Agent, or Firm* — Hanley, Flight And Zimmerman, LLC

(57) ABSTRACT

Methods and systems are disclosed to monitor a media device via a universal serial bus ("USB") port. An example method includes obtaining a voltage output by a UBS port of the media device and determining if the voltage exceeds a threshold. If the voltage exceeds the threshold, the example method includes determining the media device is in an on state. If the voltage does not exceed the threshold, the example method includes determining the media device is in an off state.

20 Claims, 12 Drawing Sheets

(51) Int. Cl.
*H04N 21/84* (2011.01)
*G06F 13/38* (2006.01)

(56) References Cited

U.S. PATENT DOCUMENTS

| | | | |
|---|---|---|---|
| 5,408,258 A | | 4/1995 | Kolessar |
| 5,532,732 A | | 7/1996 | Yuen et al. |
| 5,579,124 A | * | 11/1996 | Aijala .................... H04H 20/31 |
| | | | 386/338 |
| 6,370,586 B2 | | 4/2002 | Davis et al. |
| 6,389,544 B1 | | 5/2002 | Katagiri |
| 6,567,978 B1 | | 5/2003 | Jarrell |
| 6,633,635 B2 | | 10/2003 | Kung et al. |
| 6,880,036 B2 | | 4/2005 | Bertin et al. |
| 7,260,823 B2 | | 8/2007 | Schlack et al. |
| 7,433,990 B2 | | 10/2008 | Wurzburg et al. |
| 7,751,183 B2 | | 7/2010 | Harris |
| 7,876,779 B2 | | 1/2011 | Wilson |
| 8,752,081 B2 | * | 6/2014 | Ramaswamy ..... H04N 21/4524 |
| | | | 725/121 |
| 10,740,787 B2 | | 8/2020 | Cave et al. |
| 2006/0026162 A1 | * | 2/2006 | Salmonsen ............. G06F 16/44 |
| 2006/0282849 A1 | | 12/2006 | Lin |
| 2007/0261046 A1 | | 11/2007 | Miller |
| 2008/0255782 A1 | | 10/2008 | Bilac et al. |
| 2010/0191525 A1 | * | 7/2010 | Rabenko ............. H04L 12/2801 |
| | | | 704/211 |
| 2011/0078513 A1 | | 3/2011 | Beattie, Jr. et al. |
| 2011/0084807 A1 | | 4/2011 | Logan et al. |
| 2011/0153236 A1 | | 6/2011 | Montreuil et al. |
| 2012/0235579 A1 | | 9/2012 | Chemel et al. |
| 2013/0014136 A1 | | 1/2013 | Bhatia et al. |
| 2013/0159560 A1 | | 6/2013 | Cave et al. |
| 2016/0007083 A1 | | 1/2016 | Gurha |

OTHER PUBLICATIONS

United States Patent and Trademark Office, "Final Office Action," dated Jan. 29, 2014 in connection with U.S. Appl. No. 13/328,927, 14 pages.

United States Patent and Trademark Office, "Notice of Panel Decision from Pre-Appeal Brief Review," issued Jul. 23, 2014 in connection with U.S. Appl. No. 13/328,927, 2 pages.

United States Patent and Trademark Office, "Decision on Appeal," issued Aug. 21, 2017 in connection with U.S. Appl. No. 13/328,927, 6 pages.

United States Patent and Trademark Office, "Non-Final Office Action," dated Dec. 11, 2019 in connection with U.S. Appl. No. 15/789,332, 6 pages.

United States Patent and Trademark Office, "Notice of Allowance," dated Apr. 3, 2020 in connection with U.S. Appl. No. 15/789,332, 8 pages.

* cited by examiner

METHODS AND SYSTEMS TO MONITOR A MEDIA DEVICE VIA A USB PORT

CROSS-REFERENCE TO RELATED APPLICATIONS

This patent arises from a continuation of U.S. patent application Ser. No. 15/789,332, filed on Oct. 20, 2017, and entitled "METHODS AND SYSTEMS TO MONITOR A MEDIA DEVICE VIA A USB PORT," which is a continuation of U.S. patent application Ser. No. 13/328,927, filed on Dec. 16, 2011, and entitled "METHODS AND SYSTEMS TO MONITOR A MEDIA DEVICE VIA A USB PORT." U.S. patent application Ser. No. 15/789,332 and U.S. patent application Ser. No. 13/328,927 are hereby incorporated by reference herein for all purposes.

FIELD OF THE DISCLOSURE

This patent relates generally to home audience measurement, and, more particularly, to methods and systems to monitor a media device via a USB port.

BACKGROUND

Audience measurement of media, such as television and/or radio programs, is typically carried out by monitoring media exposure of panelists that are statistically selected to represent particular demographic groups. Using various statistical methods, the collected media exposure data is processed to determine the size and demographic composition of the audience(s) for media programs of interest. The audience size and demographic information is valuable to advertisers, broadcasters and/or other entities. For example, audience size and demographic information is a factor in the placement of advertisements, as well as a factor in valuing commercial time slots during particular programs.

DETAILED DESCRIPTION

Figure 1:
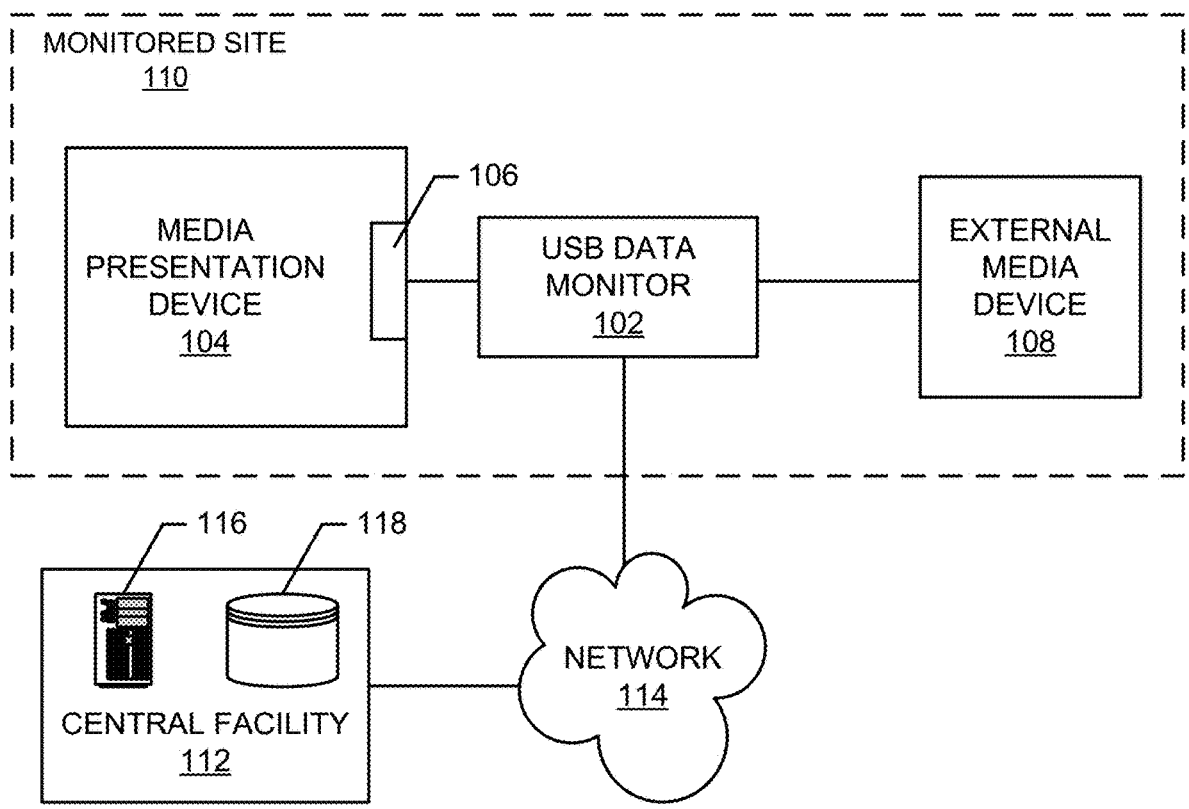
FIG. 1 illustrates an example USB data monitor implemented in accordance with the teachings of this disclosure to monitor a media presentation device via a USB port.

Audience measurement companies enlist persons to participate in measurement panels. Such persons agree to allow the audience measurement company to measure their exposure to media (e.g., television, radio, Internet, advertising, signage, outdoor advertising, etc.). In order to credit audience measurement data with actual panelist exposure, the audience measurement company may wish to monitor an operating state of a media device (e.g., the company may wish to verify that a television is on before crediting viewing of a program on the television).

Some current techniques used to monitor operating states of media devices monitor current flow in power cords of the media devices. However, some media devices are being developed to be more environmentally friendly. For example, some media devices are being designed to require less power to operate. These developments have made it more difficult to determine operating states of media devices by monitoring current flow in power cords. In addition to monitoring media devices to determine their operating states, an audience measurement company may wish to collect additional audience measurement data and/or monitor data being exchanged at the media device. Such additional data may facilitate further analysis of audience measurement data.

Example methods, apparatus, systems, and/or computer readable storage media disclosed herein monitor an operating state of a media device and/or monitor data being exchanged at the media device via a universal serial bus ("USB") port. For instance, some disclosed example methods include obtaining a voltage output by a USB port of a media device. Some such disclosed example methods include determining if the voltage exceeds a threshold. If the voltage exceeds the threshold, some such disclosed example methods determine the media device is in an on state. If the voltage does not exceed the threshold, some such disclosed example methods determine the media device is in an off state.

Some disclosed example methods include obtaining a signal at a USB port of a media device. Some such disclosed example methods include determining a bit rate of the signal and determining if the bit rate exceeds a threshold. If the bit rate exceeds the threshold, some such disclosed example methods determine the media device is involved in a data transfer. If the bit rate does not exceed the threshold, some such disclosed example methods determine the media device is not involved in a data transfer.

Some disclosed example systems include a voltage input to obtain a voltage output by a USB port of a media device. Some such disclosed example systems include a voltage comparator to determine the media device is in an on state if the voltage exceeds the threshold. If the voltage does not exceed the threshold, the voltage comparator of some such disclosed example systems determines the media device is in an off state.

Some disclosed example systems include a data input to obtain a signal at a USB port of a media device. Some such disclosed example systems include a bit rate comparator to determine the media device is involved in a data transfer if the bit rate exceeds a threshold. If the bit rate does not exceed the threshold, the bit rate comparator of some such disclosed example systems determine the media device is not involved in a data transfer.

Some disclosed example tangible computer-readable storage media include instructions that, when executed, cause a computing device to at least compare a voltage output by a USB port of a media device to a threshold. The instructions of some such examples cause the computing device to determine the media device is in an on state if the voltage exceeds the threshold. In some examples, instructions, when executed, cause the computing device to determine the media device is in an off state if the voltage does not exceed the threshold.

Some disclosed example tangible computer-readable storage media include instructions that, when executed, cause a computing device to determine a bit rate of a signal at a USB port of a media. In some such examples, instructions, when executed, cause the computing device to determine the media device is involved in a data transfer if the bit rate exceeds a threshold. The instructions of some such examples cause the computing device to determine the media device is not involved in a data transfer if the bit rate does not exceed the threshold.

Many media devices (e.g., televisions, digital versatile disk ("DVD") players, computers, stereo systems, and/or game consoles) are now manufactured with USB ports to allow the media devices to communicate with other devices, present and/or output content from other devices, control other devices, etc. USB interfaces are often preferred by manufacturers and consumers alike as they provide for standardized connections, communication, and power supply between connected devices (e.g., media devices).

Generally, a USB port integrated in a device is powered by that device. Thus, a USB port of a media device is powered on when the media device is powered on and is powered off when the media device is powered off. When, for example, a media device is powered on, the integrated USB port of that media device provides a power supply (e.g., a 5 V power supply) on a pin from which a connected device may draw power. Alternatively, when the media device is powered off, its USB port does not provide any power supply to connected devices.

To transmit and/or receive signals, most USB interfaces include two data pins (D+ and D−) connected to a twisted-pair data cable and utilize half-duplex differential signaling. USB data is transmitted by toggling the data lines between opposite states and is encoded using the Non Return to Zero Inverted (NRZI) convention. Using the NRZI convention, a low bit is transmitted by toggling the data lines and a high bit is transmitted by leaving the data lines as-is. USB communication is implemented using packets. Generally, two data packets are used to transfer data and each data packet is capable of transmitting up to 1024 bytes of data.

Example USB data monitors disclosed herein advantageously use the characteristics of a USB port described above to monitor activities of a media device housing a USB port. In some examples, a USB data monitor connects to a USB port of a media presentation device, such as a television, and monitors power supplied to the USB port to determine an operating state of the media presentation device. Based on the availability of power at the USB port, the USB data monitor determines, stores, and/or reports an on or off state of the media presentation device.

In some disclosed examples, a USB data monitor obtains a signal at a USB port of a media presentation device and determines if the media presentation device is involved in a data transfer. The example USB data monitor stores and/or reports transfer activity data representative of an occurrence of a data transfer. In some examples, the USB data monitor collects data from the signal and stores and/or transfers the collected data to a central monitoring site. The USB data monitors of some examples transfer operating state data, transfer activity data, and/or collected data to a central data facility and/or a metering device either wirelessly or directly for further audience measurement processing.

Some example USB data monitors disclosed herein are implemented in the context of home audience measurement. In some examples, the USB data monitors enable a determination of an operating state of a media presentation device, a determination of whether the media presentation device is involved in a data transfer, and/or collection of data being transferred and/or received by the media presentation device using a USB port. This information is a factor in determining when and/or whether to monitor (i.e., collect) audience measurement data and/or whether to credit collected data as actual exposure.

FIG. 1 illustrates an example USB data monitor 102 implemented in accordance with the teachings of this disclosure to monitor a media presentation device 104 via a USB port 106. The USB port 106 of the illustrated example forms part of (e.g., is integrated with) the example media presentation device 104. In the illustrated example, the USB data monitor 102, the media presentation device 104, and an external media device 108 are located in a home monitoring site 110. The home monitoring site 110 of the illustrated example is a household that has volunteered, has been selected and/or has agreed to participate in a home audience measurement system (e.g., residents of the household have agreed to monitoring of their media exposure).

The USB data monitor 102 of the illustrated example is used to monitor the media presentation device 104 to aid in the processing of audience measurement data obtained at the monitored site 110. In the illustrated example, the USB data monitor 102 connects to the USB port 106 of the media presentation device 104. Many devices, such as the media presentation device 104, are equipped with USB ports to enable communication with external devices, such as the external media device 108. The media presentation device 104 may be, for example, a television, a radio, a computer, a stereo system, a DVD player, a game console, etc. The external media device 108 may be, for example, a DVD player, a digital camera, a game console, a speaker, etc.

The USB data monitor 102 of the illustrated example operates as a pass-through device so that communication between the media presentation device 104 and the external media device 108 is not disturbed (e.g., the external media device 108 can be used as normal while the USB data monitor 102 is connected). Further, the USB data monitor 102 of the illustrated example does not interfere with operation of the media presentation device 104. To operate as a pass-through device, the example USB data monitor 102 of the illustrated example includes a male USB connector to connect to the USB port 106 (e.g., directly or indirectly via a cable) and a female USB connector to connect to the external media device 108 (e.g., directly or indirectly via a cable).

To aid in processing audience measurement data obtained at the monitored site 110, the USB data monitor 102 of the illustrated example monitors power at the USB port 106 and/or signals being transmitted and/or received at the USB port 106 of the media presentation device 104. In the illustrated example, the USB data monitor 102 determines an operating state of the media presentation device 104 (i.e., whether the media presentation device 104 is in an on or off state) by monitoring the availability of power at the USB port 106. As described above, when the example media presentation device 104 is powered on, the USB port 106 is powered on and a connected device (e.g., the USB data monitor 102) may draw from that power. When the example media presentation device 104 is powered off, power is not available at the USB port 106. While the USB data monitor 102 of the illustrated example allows the external media device 108 to communicate with the media presentation device 104, the USB data monitor 102 may determine an operating state of the media presentation device 104 when no external device (e.g., the external media device 108) is connected.

To monitor the availability of power at the media presentation device 104, the USB data monitor 102 of the illustrated example obtains a voltage output by the USB port 106 of the media presentation device 104. The USB port 106 of the media presentation device 104 of the illustrated example includes a power pin and a ground pin. The USB data monitor 102 of the illustrated example compares the magnitude of the voltage obtained on the power pins (e.g., a differential voltage) of the USB port 106 to a voltage threshold. If the magnitude of the voltage exceeds the voltage threshold, the USB data monitor 102 of the illustrated example determines that the media presentation device 104 is in an on state. If the magnitude of the voltage does not exceed the voltage threshold, the USB data monitor 102 of the illustrated example determines that the media presentation device 104 is in an off state. The voltage threshold may be any value that, if exceeded, would indicate that the media presentation device 104 is powered on. Thus, the voltage threshold may be, for example, the value "0."

The operating state of the media presentation device 104 is important in the context of home audience measurement to determine whether to credit collected audience measurement data as data actually presented to an audience. For example, it is possible for a media device, such as a set top box, integrated receiver decoder, cable converter, etc., to output media signals that are not actually presented to an audience because the corresponding information presenting device (e.g., a television) is turned off. Detecting if the information presenting device is on or off is, thus, an important clue in determining whether to credit an audience with exposure to media (e.g., media content or an advertisement), especially in instances where the source device (e.g., the set top box) is monitored to identify content or tuning information and the source device may be left on when the information presenting device is off.

In some examples, the USB data monitor 102 monitors signals being transmitted and/or received at the USB port 106 to determine if the media presentation device 104 is involved in a data transfer. A data transfer may indicate, for example, that data is being passed between the media presentation device 104 and the external media device 108 and, thus, that a panelist is being exposed to content on the media presentation device 104 using the external media device 108. To determine if the media presentation device 104 is involved in a data transfer, the USB data monitor 102 of the illustrated example monitors signals being transmitted and/or received at the USB port 106 of the media presentation device 104. When the USB port 106 of the illustrated example is not transmitting and/or receiving data packets, traffic at the USB port 106 of the media presentation device 104 will be relatively insignificant. For example, small amounts of bytes (e.g., not more than 100 bytes) will be transferred. During a data transfer, however, the traffic at the USB port 106 of the media presentation device 104 will be more significant, for example, tens of kilobytes or megabytes of data transferred per second.

To determine if the media presentation device 104 is involved in a data transfer, the USB data monitor 102 of the illustrated example obtains a signal at two data pins on the USB port 106 of the media presentation device 104 and determines a bit rate of the signal. In the illustrated example, the USB data monitor 102 collects (e.g., copies) the signal for some time interval, extracts bits from the collected signal, and determines an associated bit rate. The USB data monitor 102 of the illustrated example compares the bit rate of the signal to a threshold. If the bit rate exceeds the threshold, the USB data monitor 102 of the illustrated example determines that the media presentation device 104 is involved in a data transfer. If the bit rate does not exceed the threshold, the USB data monitor 102 of the illustrated example determines that the media presentation device 104 is not involved in a data transfer. The threshold may be set to any value that, if exceeded, would indicate a data transfer at the media presentation device 104.

In some examples, the USB data monitor 102 collects data from the signal at the USB port 106 of the media presentation device 104. Collected data may include, for example, a type of data transfer occurring, source information, a payload, a media or station identifier code extracted from the audio, metadata, a signature (e.g., an inherent characteristic of the signal that may be used as a fingerprint to identify the signal and/or the media it carries), video data, and/or data. The collecting of data from the signal may be continuous and/or may be triggered, for example, by a determination of the USB data monitor 102 of the illustrated example that the media presentation device 104 is involved in a data transfer.

Consumers often utilize external media devices (e.g., DVD players, set top boxes, etc.) to view content on media presentation devices, such as the media presentation device 104. Use of the USB data monitor 102 to determine if the media presentation device 104 is involved in a data transfer (e.g., sending and/or receiving data) and/or to collect data from data traffic are useful in the context of home audience measurement to determine whether to credit collected audience measurement data (e.g., in determining whether data from the external media device 108 is actually presented via the media presentation device 104) and to analyze collected audience measurement data.

Once the USB data monitor 102 has determined an operating state of the media presentation device 104, determined if the media presentation device 104 is involved in a data transfer, and/or has collected data from the data traffic, the USB data monitor 102 of the illustrated example stores and timestamps the determined information and/or data. For example, the USB data monitor 102 of the illustrated example stores and timestamps operating state data representative of whether the media presentation device 104 is in an on state or an off state. Operating state data may be, for example, a bit set high to indicate the media presentation device 104 is powered on and/or a bit set low to indicate the media presentation device 104 is powered off. In some examples, the USB data monitor 102 additionally or alternatively stores and timestamps transfer activity data representative of an occurrence of a data transfer at the media presentation device 104. Transfer activity data may be, for example, a bit set high to indicate a data transfer at the media presentation device 104 and/or a bit set low to indicate no data transfer at the media presentation device 104. In some examples, the USB data monitor 102 stores and timestamps data collected from the signal at the USB port 106 of the media presentation device 104.

In the illustrated example, the USB data monitor 102 transmits operating state data, transfer activity data, collected data, and/or the signal itself to a remotely located central data collection facility 112 via a network 114 for further processing. The central facility 112 of the illustrated example collects and/or stores, for example, media exposure data, media monitoring data, and/or demographic information that is collected by multiple media monitoring devices such as, for example, the USB data monitor 102 associated with different monitored sites. The central facility 112 may be, for example, a facility associated with The Nielsen Company (US), LLC or any affiliate of The Nielsen Company (US), LLC. The central facility 112 of the illustrated example includes a server 116 and a database 118 that may be implemented using any suitable processor, memory and/or data storage apparatus such as that shown in FIG. 12.

The network 114 of the illustrated example is used to communicate information and/or data between the example USB data monitor 102 and the central facility 112. The network 114 may be implemented using any type of public and/or private network such as, but not limited to, the Internet, a telephone network, a local area network ("LAN"), a cable network, and/or a wireless network. To enable communication via the network 114, the USB data monitor 102 of the illustrated example includes a communication interface that enables connection to an Ethernet, a digital subscriber line ("DSL"), a telephone line, a coaxial cable, and/or any wireless connection, etc.

Figure 2:
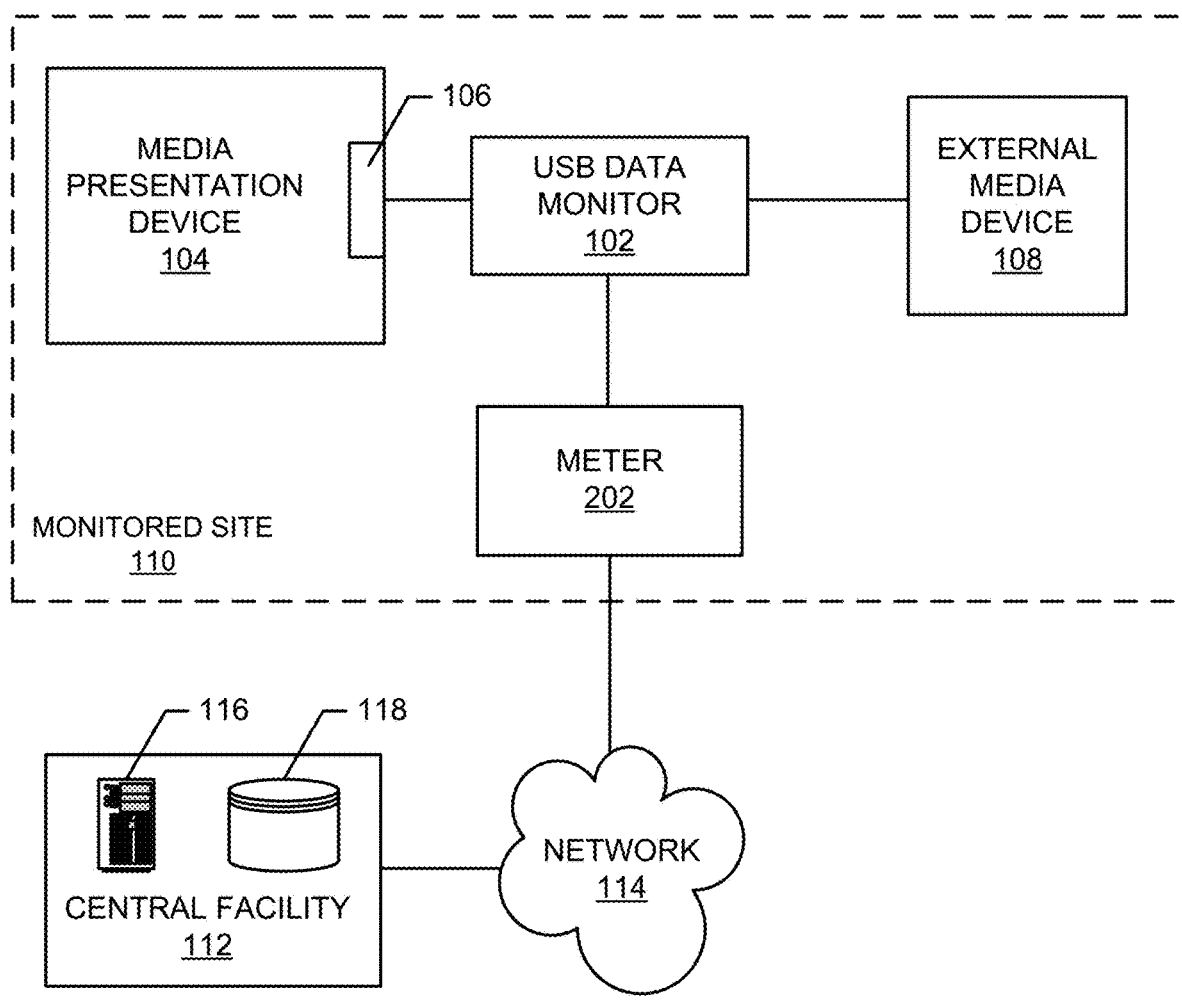
FIG. 2 illustrates the example USB data monitor of FIG. 1 cooperating with a meter.

FIG. 2 illustrates an example manner in which the USB data monitor 102 of FIG. 1 may be employed to monitor the media presentation device 104 via the USB port 106. As in the example of FIG. 1, the central facility 112 collects and aggregates data from any number of monitored sites 110 via the network 114. In the illustrated example, a meter 202 is included in the monitored home site 110. The meter 202 of the illustrated example is located at the monitored site 110 to perform local processing of information collected by the example USB data monitor 102.

As in the example of FIG. 1, the USB data monitor 102 connects to the USB port 106 of the media presentation device 104 to monitor the media presentation device 104. The USB data monitor 102 of the illustrated example determines an operating state of the media presentation device 104. The USB data monitor 102 may additionally or alternatively determine if the media presentation device 104 is involved in a data transfer, and/or may collect data from the signal at the USB port 106 of the media presentation device 104.

In the illustrated example, the USB data monitor 102 transfers collected data such as operating state data, transfer activity data, codes, signatures, metadata, and/or other data to the meter 202. The meter 202 of the illustrated example collects audience measurement data from the USB data monitor 102 and/or any other device used to collect audience measurement data, such as, for example, a people meter which collects information to identify persons in the audience. The meter 202 of the illustrated example collects and/or processes the home audience measurement data locally and/or transfers the processed data to the central data facility 112 via the network 114. For example, if the USB data monitor 102 provides the meter 202 with a media signal (e.g., an audio portion of a media signal), the meter 202 may process the media signal (or a portion thereof) to extract codes and/or metadata, and/or to generate signatures for use in identifying the media and/or a station transmitting the media. In some examples, the meter 202 may perform the timestamping discussed above. In some examples, a concentrator is used to collect data from two or more audience measurement devices distributed throughout the monitored site 110 and to pass the collected data to the meter 202.

The meter 202 of the illustrated example uses data collected from multiple devices, including the USB data monitor 102, to make determinations about media exposure. For example, the meter 202 may receive transfer activity data from the USB data monitor 102 indicating that the media presentation device 104 is involved in a data transfer (e.g., a bit set high to indicate a data transfer). Because the USB data monitor 102 determined that the media presentation device 104 was involved in a data transfer, the meter 202 may determine that content is being provided by the external media device 108 coupled to the USB port 106. In some examples, the meter 202 may compare data collected from the USB data monitor 102 (e.g., audio) to audio present at a speaker to identify the external media device 108 as the source of the audio. The meter 202 of the illustrated example then passes determined and/or collected data to the central facility 112 via the network 114. The data may be data from the USB data monitor 102, data collected by the meter 202, and/or data collected by other devices.

In the illustrated example, the USB data monitor 102 and the meter 202 are connected using wired connections (for example, Ethernet cables and/or fiber optic cables). In some examples, the USB data monitor 102 transfers information and/or data to the meter 202 wirelessly.

Figure 3:
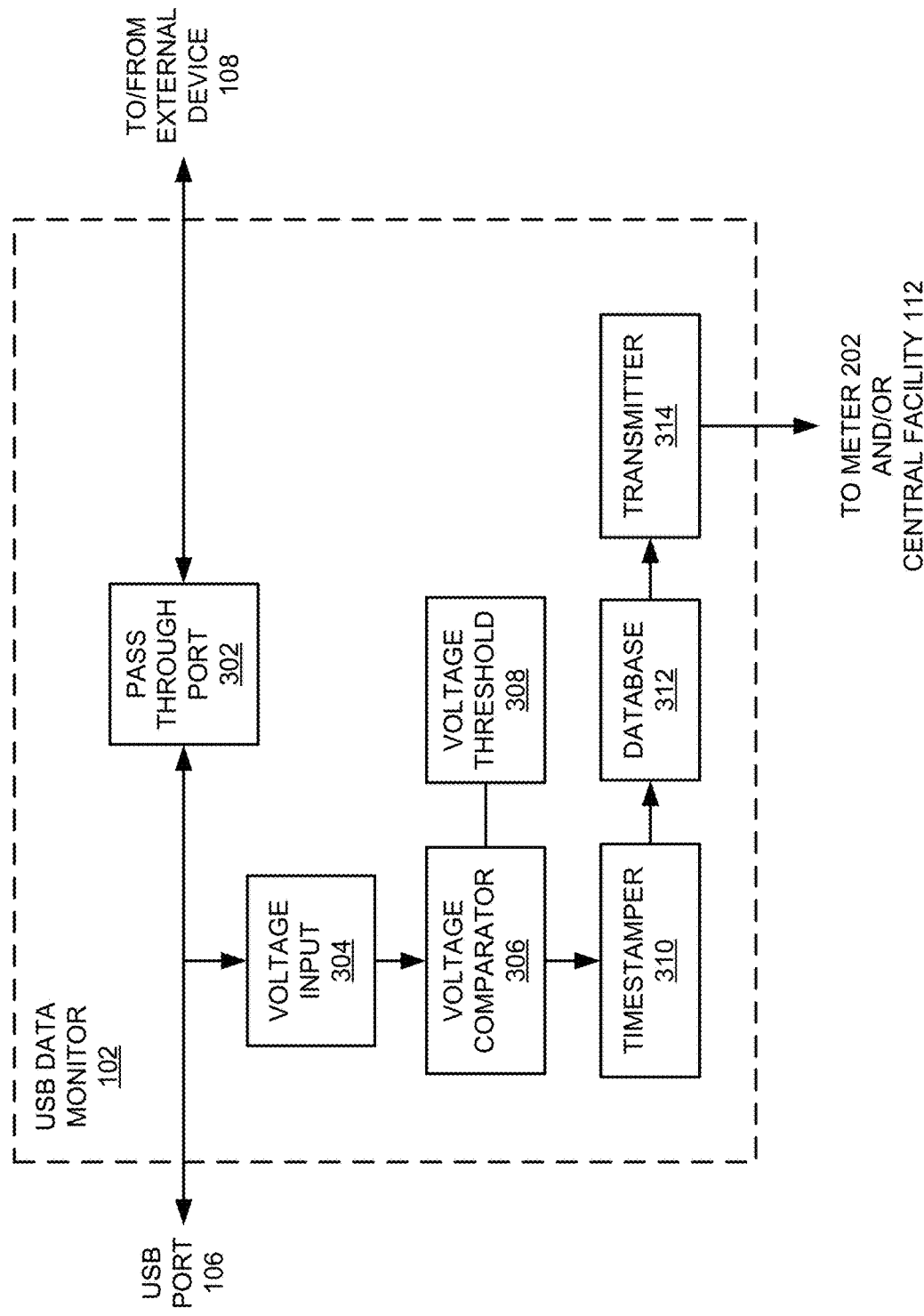
FIGS. 3-5 illustrate example implementations of the USB data monitor of FIGS. 1 and 2.

FIG. 3 is a block diagram of an example implementation of the USB data monitor 102 of FIGS. 1 and/or 2. In the illustrated example, the USB data monitor 102 is used to determine an operating state of a media presentation device, for example, the media presentation device 104 of FIG. 1. The USB data monitor 102 of the illustrated example monitors an availability of power at the USB port 106 to determine the operating state of the media presentation device 104. In the illustrated example, the USB data monitor 102 includes a pass through port 302, a voltage input 304, a voltage comparator 306, a voltage threshold 308, a timestamper 310, a database 312, and a transmitter 314.

The pass through port 302 of the illustrated example allows communication between the media presentation device 104 and an external device (e.g., the external media device 108) to operate undisturbed. The power and/or data at the USB port 106 is passed to the external media device 108 by the pass through port 302 of the illustrated example so that the external media device 108 can be used as normal while the USB data monitor 102 is connected. The pass through port 302 also allows data to pass from the external media device 108 to the USB port 106. Although the pass through port 302 of the illustrated example allows the USB data monitor 102 to monitor the media presentation device 104 while the external media device 108 is connected, the USB data monitor 102 may monitor the media presentation device 104 when the external media device 108 is not connected.

The voltage input 304 of the illustrated example is used to obtain a voltage output by the USB port 106 of the media presentation device 104 (e.g., on the power pins of the USB port 106). The voltage comparator 306 of the illustrated example compares the magnitude of the voltage detected at the power pins (e.g., a differential voltage) of the USB port 106 to the voltage threshold 308. If the detected voltage exceeds the voltage threshold 308, the voltage comparator 306 determines that the media presentation device 104 is in an on state. If the detected voltage does not exceed the voltage threshold 308, the voltage comparator 306 determines that the media presentation device 104 is in an off state. The voltage threshold 308 of the illustrated example may be any value that, if exceeded, would indicate that the media presentation device 104 is powered on, for example, the value "0." The voltage detected from the USB port 106 may be conditioned (e.g., rectified) to enable the comparison of the magnitude of the detected voltage to the threshold 308 without accounting for polarity.

The voltage comparator 306 of the illustrated example transfers operating state data to the timestamper 310. The operating state data is indicative of whether the media presentation device 104 is in an on or an off state. The operating state data may be, for example, a bit set high to indicate the media presentation device 104 is in an on state and/or a bit set low to indicate the media presentation device 104 is in an off state. The timestamper 310 of the illustrated example timestamps the operating state data to record times and/or dates at which the media presentation device 104 is in the corresponding operating state. The timestamper 310 passes the timestamped operating state data to the database 312 where the timestamped operating state data is stored. The timestamped operating state data is passed to the transmitter 314 of the illustrated example to be transmitted from the data monitor 102 to a meter, for example, the meter 202 of FIG. 2.

In some examples, the transmitter 314 passes operating state data directly to a central facility, such as the central facility 112 of FIG. 1, when no meter 202 is present. In some examples, the operating state data is passed directly from the voltage comparator 306 to the transmitter 314 to be transmitted to the meter 202 and the meter 202 performs the timestamping. In the illustrated example, the data monitor 102 transfers the operating state data to the meter 202 using a wired connection. In other examples, the data monitor 102 transfers the operating state data to the meter 202 wirelessly.

Figure 4:
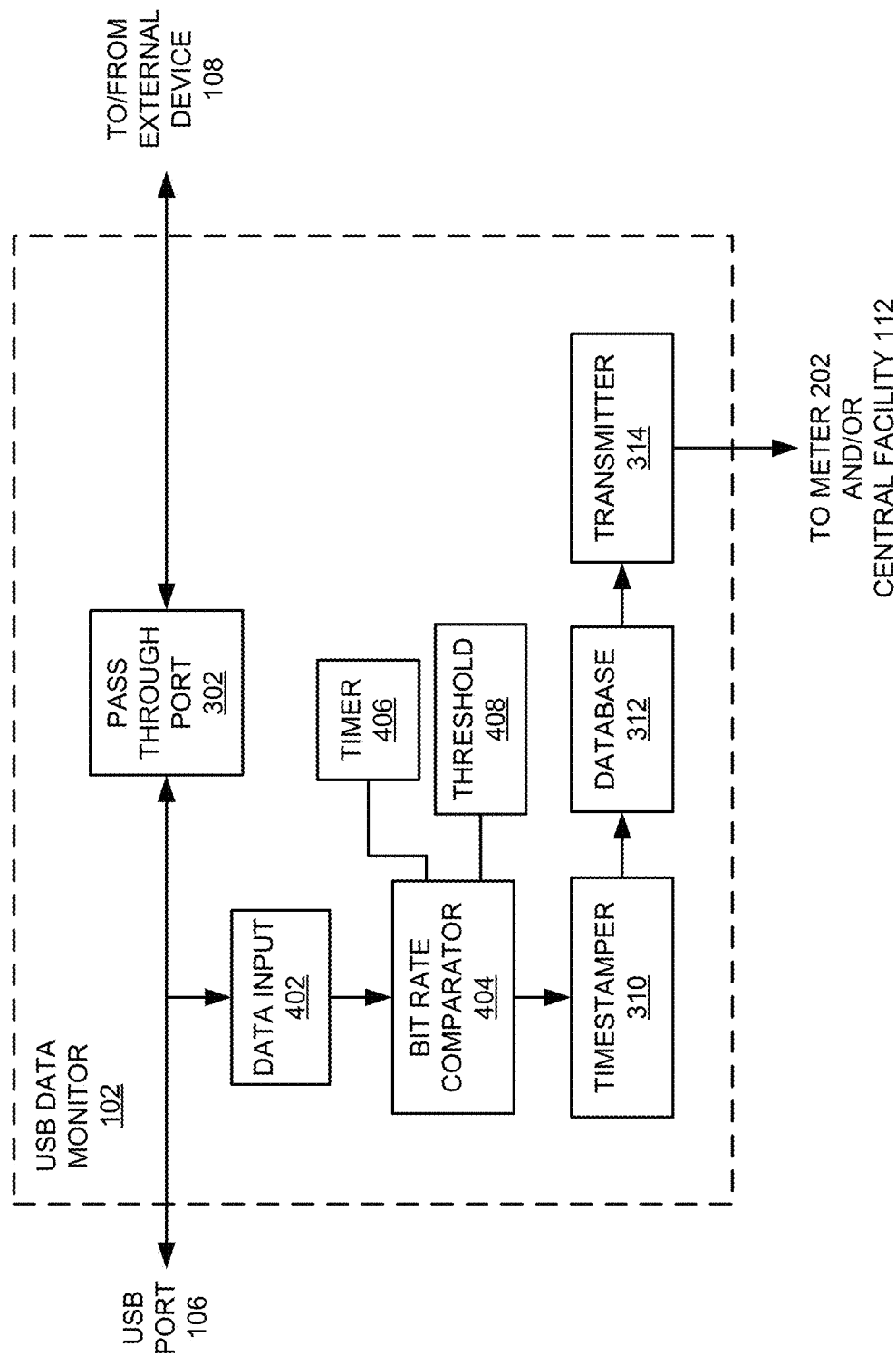

FIG. 4 is a block diagram of another example implementation of the USB data monitor 102 of FIGS. 1 and 2. In the illustrated example, the USB data monitor 102 is used to detect an occurrence of a data transfer to and/or from the media presentation device, for example, the media presentation device 104 of FIG. 1. The USB data monitor 102 of the illustrated example detects an occurrence of a data transfer by monitoring signal traffic at the USB port 106 of the media presentation device 104. In the illustrated example, the USB data monitor 102 includes a pass through port 302, a data input 402, a bit rate comparator 404, a timer 406, a data threshold 408, a timestamper 310, a database 312, and a transmitter 314. The pass through port 302, the timestamper 310, the database 312, and the transmitter 314 are similar to their counterparts in the example of FIG. 3 and, thus, have been assigned the same reference numerals. Elements numbered with like reference numbers are substantially similar and/or identical and, thus, are not redescribed in detail here. Instead, the intended reader is referred to the above descriptions of the like numbered elements for a full and complete description of the same.

The data input 402 of the illustrated example is used to obtain a signal at the USB port 106 (e.g., a transmitted or received signal) of the media presentation device 104 (e.g., on the data pins of the USB port 106). The traffic flow across the data pins is a relatively small amount when there is no data transfer occurring at the media presentation device 104 and is a larger amount when a data transfer is occurring at the media presentation device 104. The signal at the USB port 106 is a differential signal and may be converted to a single-ended output (e.g., using a transceiver) once received by the data input 402 prior to analysis by the bit rate comparator 404.

The bit rate comparator 404 of the illustrated example tracks the number of bits being transmitted and/or received at the data input 402 and, in cooperation with a clock signal output by the timer 406, determines a bit rate of the signal at the data input 402. For example, the bit rate comparator 404 sets a time interval to be used to determine the bit rate of the signal. The bit rate comparator 404 starts the timer 406 and begins to extract bits being transmitted and/or received at the data input 402. The bit rate comparator 404 continues to extract bits from the signal until the timer 406 indicates that the set time interval has lapsed. The bit rate comparator 404 counts the bits extracted during the time interval. The bit rate comparator 404 determines the bit rate of the signal by dividing the number of bits transmitted and/or received at the data input 402 by the time interval tracked by the timer 406.

The bit rate comparator 404 of the illustrated example compares the determined bit rate to the threshold 408. If the bit rate exceeds the threshold 408, the bit rate comparator 404 determines the media presentation device 104 is involved in a data transfer. If the bit rate does not exceed the threshold 408, the bit rate comparator 404 determines the media presentation device 104 is not involved in a data transfer. The data threshold 408 may be any value that, if exceeded, would indicate an occurrence of a data transfer at the media presentation device 104.

The bit rate comparator 404 of the illustrated example transfers transfer activity data indicative of whether the media presentation device 104 is determined to be involved in a data transfer or not involved in a data transfer to the timestamper 310. This transfer activity data may be, for example, a bit set high to indicate a data transfer and/or a bit set low to indicate no data transfer. The timestamper 310 of the illustrated example timestamps the transfer activity data and passes the transfer activity data to the database 312 where the transfer activity data is stored. The timestamped transfer activity data is passed to the transmitter 314 of the illustrated example to be transmitted from the data monitor 102 to a meter, for example, the meter 202 of FIG. 2. In some examples, the transmitter 314 passes transfer activity data to a central facility, such as the central facility 112 of FIG. 1, when no meter 202 is present. In some examples, the transfer activity data is passed directly from the bit rate comparator 404 to the transmitter 314 to be transmitted to the meter 202 and the meter 202 performs the timestamping (e.g., the timestamper 310 is omitted from the USB data monitor 102). In the example illustrated in FIG. 5, the data monitor 102 transfers the transfer activity data to the meter 202 using a wired connection. In some examples, the data monitor 102 transfers the transfer activity data to the meter 202 wirelessly.

Figure 5:
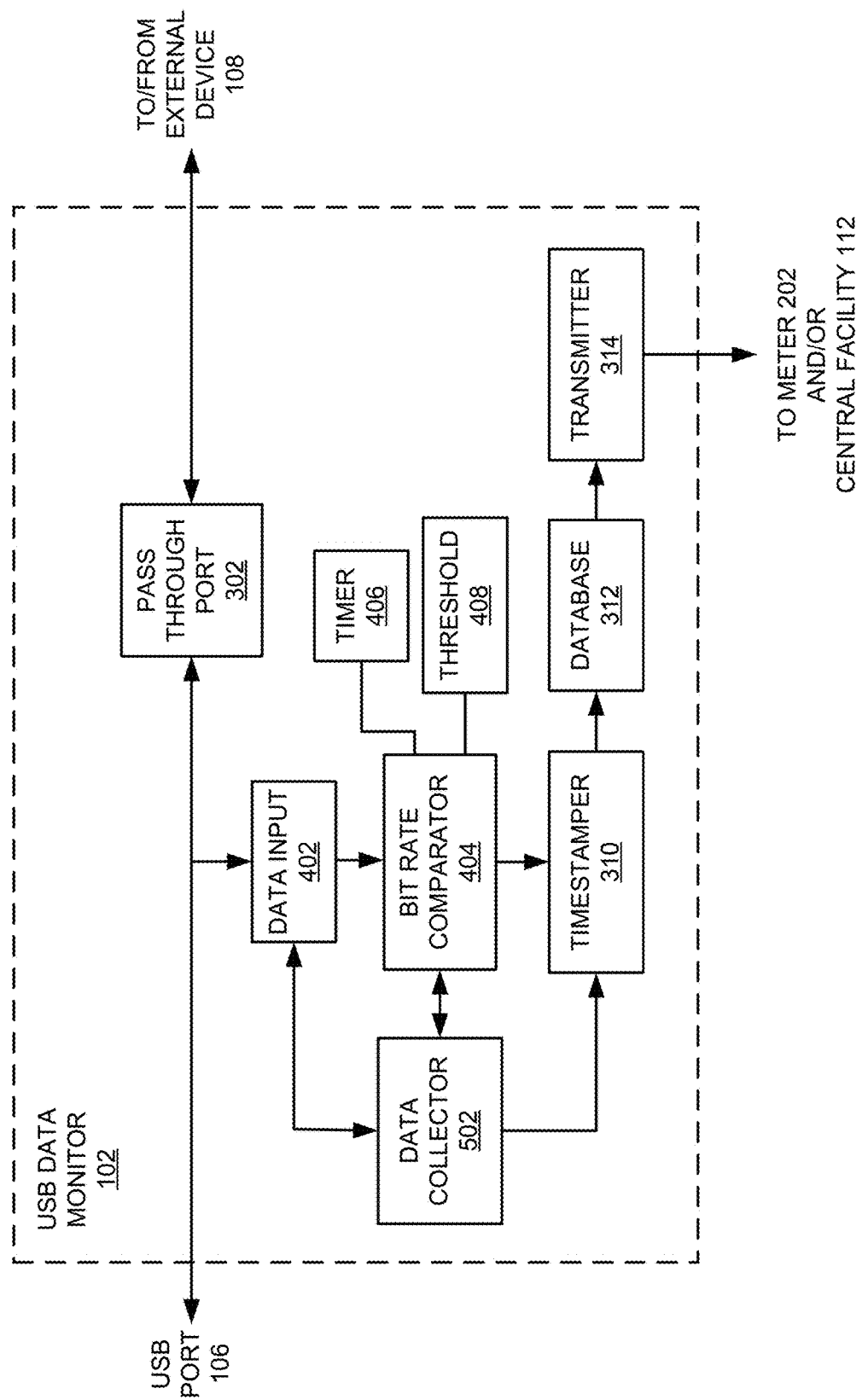

FIG. 5 is a block diagram of another example implementation of the USB data monitor 102 of FIGS. 1 and/or 2. In the illustrated example, the USB data monitor 102 detects a data transfer at the USB port 106 of the monitored media presentation device 104, and additionally operates to collect data from the signal at the USB port 106 of the monitored media presentation device 104. In the illustrated example, the USB monitor 102 includes a pass through port 302, a data input 402, a bit rate comparator 404, a timer 406, a threshold 408, a timestamper 310, a database 312, a transmitter 314, and a data collector 502. The pass through port 302, the data input 402, the bit rate comparator 404, the timer 406, the threshold 408, the timestamper 310, the database 312, and the transmitter 314 of FIG. 5 are similar to their counterparts in the examples of FIGS. 3 and 4 and, thus, have been assigned the same reference numerals. Elements numbered with like reference numbers are substantially similar and/or identical and, thus, are not redescribed in detail here. Instead, the intended reader is referred to the above descriptions of the like numbered elements for a full and complete description of the same.

The data collector 502 of the illustrated example collects data from the signal obtained by the data input 402 at the USB port 106 of the media presentation device 104. Collected data may include, for example, a type of data transfer occurring, source information, a payload, a code, metadata, a signature and/or the audio signal itself. The data collector 502 of the illustrated example collects data constantly. In some examples, the collection of data is periodic or aperiodic, and/or may be triggered, for example, by the determination of the bit rate comparator 404 that the media presentation device 104 is involved in a data transfer. The data collector 502 of the illustrated example transfers the collected data to the timestamper 310 to be timestamped and stored in the database 312. The timestamped data is passed to the transmitter 314 of the illustrated example to be transmitted to a meter, for example, the meter 202 of FIG. 2. In some examples, the transmitter 314 transfers data and/or the audio signal directly to a central facility, for example, the central facility 112 of FIG. 1, when no meter 202 is present. In some examples, the data collector 502 transfers the data and/or the audio signal directly to the transmitter 314 to be transmitted to the meter 202 and the meter performs the timestamping (e.g., the timestamper 310 is omitted). In the illustrated example, the data monitor 102 transfers the collected data and/or the audio signal to the meter 202 using a wired connection. In some examples, the data monitor 102 transfers the collected data and/or the audio signal to the meter 202 wirelessly.

The components of the example USB data monitors 102 illustrated in FIGS. 3-5 may be implemented to enable the USB data monitor 102 to perform any combination of or all of: monitoring the operating state of the media presentation device 104, detecting a data transfer at the media presentation device 104, and/or collecting data at the media presentation device 104.

While example USB data monitors 102 have been illustrated in FIGS. 3-5, one or more of the elements, processes and/or devices illustrated in FIGS. 3-5 may be combined, divided, re-arranged, omitted, eliminated and/or implemented in any other way. Further, the pass through port 302, the voltage input 304, the voltage comparator 306, the voltage threshold 308, the timestamper 310, the database 312, the transmitter 314, the data input 402, the bit rate comparator 404, the timer 406, the threshold 408, the data collector 502, and/or, more generally, the example USB data monitors 102 of FIGS. 3-5 may be implemented by hardware, software, firmware and/or any combination of hardware, software and/or firmware. Thus, for example, any of the example pass through port 302, the voltage input 304, the voltage comparator 306, the voltage threshold 308, the timestamper 310, the database 312, the transmitter 314, the data input 402, the bit rate comparator 404, the timer 406, the threshold 408, the data collector 502, and/or, more generally, the example USB data monitors 102 of FIGS. 3-5 could be implemented by one or more circuit(s), programmable processor(s), application specific integrated circuit(s) ("ASIC(s)"), programmable logic device(s) ("PLD(s)") and/or field programmable logic device(s) ("FPLD(s)"), etc. When any of the apparatus or system claims of this patent are read to cover a purely software and/or firmware implementation, at least one of the example pass through port 302, the voltage input 304, the voltage comparator 306, the voltage threshold 308, the timestamper 310, the database 312, the transmitter 314, the data input 402, the bit rate comparator 404, the timer 406, the threshold 408, and/or the data collector 502 are hereby expressly defined to include a tangible computer readable medium such as a memory, DVD, compact disc ("CD"), etc. storing the software and/or firmware. Further still, the example USB data monitors 102 of FIGS. 3-5 may include one or more elements, processes and/or devices in addition to, or instead of, those illustrated in FIGS. 3-5, and/or may include more than one of any or all of the illustrated elements, processes and devices.

Figure 6:
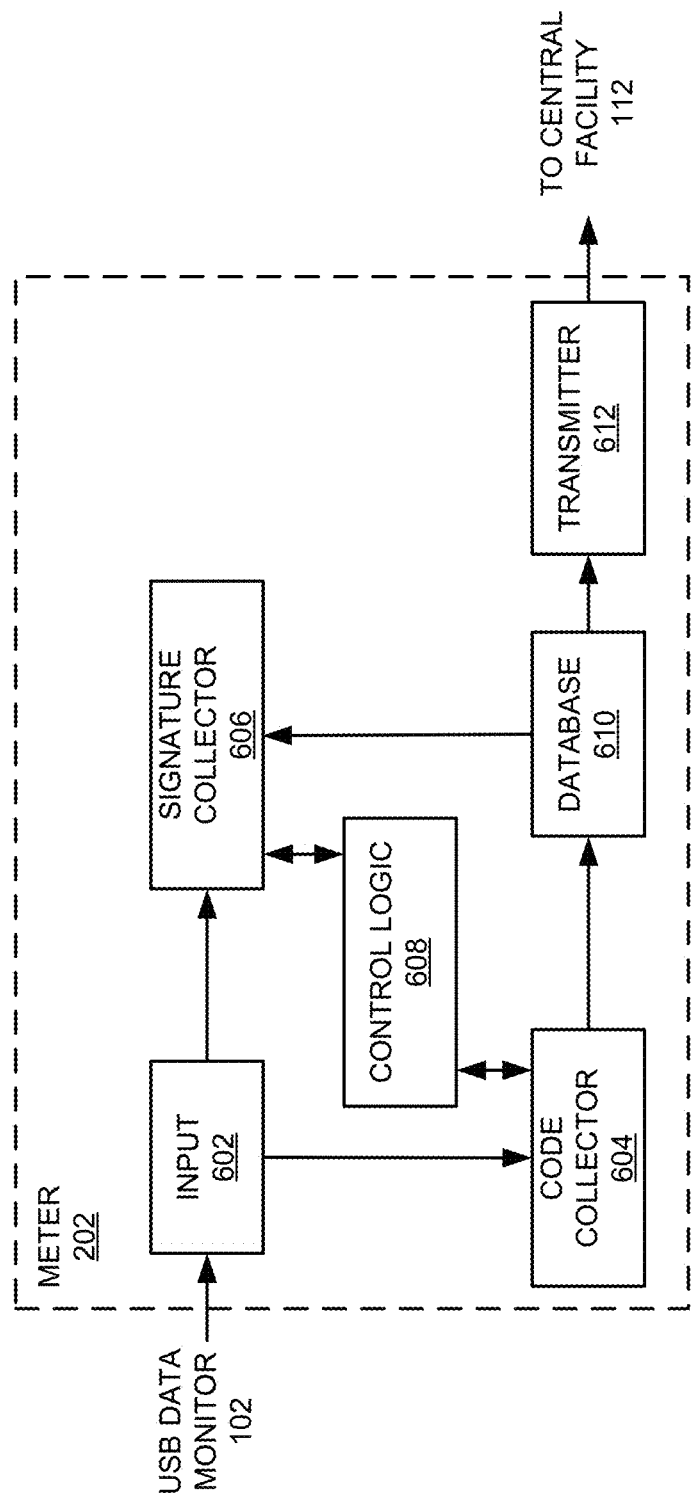
FIG. 6 illustrates an example implementation of the meter of FIG. 2.

FIG. 6 is a block diagram of an example implementation of the meter 202 of FIG. 2. The meter 202 of the illustrated example is used to collect, aggregate, locally process, and/or transfer data to a central data facility, such as the central data facility 112, via the network 114 of FIG. 1. In the illustrated example, the meter 202 is used to extract and/or analyze codes and/or signatures from data and/or signals collected by the USB data monitor 102 and/or input to the meter 202 in another manner (e.g., free field audio detected by the meter 202 with a microphone exposed to ambient sound). In some examples, the meter 202 collects data from multiple devices using, for example, a concentrator. The meter 202 of the illustrated example includes an input 602, a code collector 604, a signature generator 606, control logic 608, a database 610, and a transmitter 612.

Identification codes, such as watermarks, ancillary codes, etc. may be embedded within media signals. Identification codes are digital data that are inserted into content (e.g., audio) to uniquely identify broadcasters and/or media (e.g., content or advertisements), and/or are carried with the media for another purpose such as tuning (e.g., packet identifier headers ("PIDs") used for digital broadcasting). Codes are typically extracted using a decoding operation.

Signatures are a representation of some characteristic of the media signal (e.g., a characteristic of the frequency spectrum of the signal). Signatures can be thought of as fingerprints. They are typically not dependent upon insertion of identification codes in the media, but instead preferably reflect an inherent characteristic of the media and/or the media signal. Systems to utilize codes and/or signatures for audience measurement are long known. See, for example, Thomas, U.S. Pat. No. 5,481,294, which is hereby incorporated by reference in its entirety.

In the illustrated example, the input 602 obtains a data signal from a device, such as the USB data monitor 102. In some examples, the input 602 is a microphone exposed to ambient sound in a monitored location and serves to collect audio played by an information presenting device. As described above, the USB data monitor 102 may collect data and/or an output of the signal (e.g., the audio component) from the USB port 106 of the media presentation device 104. Thus, in some examples, the input 602 receives the signal or a portion of the signal (e.g., the audio) from the USB data monitor 102. The input 602 of the illustrated example passes the received signal (e.g., a digital audio signal) to the code collector 604 and/or the signature generator 606. The code collector 604 of the illustrated example extracts codes and/or the signature generator 606 generates signatures from the signal to identify broadcasters, channels, stations, and/or programs. The control logic 608 of the illustrated example is used to control the code collector 604 and the signature generator 606 to cause collection of a code, a signature, or both a code and a signature. The identified codes and/or signatures are stored in the database 610 of the illustrated example and are transmitted to the central facility 112 via the network 114 by the transmitter 612 of the illustrated example. Although the example of FIG. 6 collects codes and/or signatures from an audio signal, codes or signatures can additionally or alternatively be collected from other portion(s) of the signal (e.g., from the video portion).

While an example meter 202 has been illustrated in FIG. 6, one or more of the elements, processes and/or devices illustrated in FIG. 6 may be combined, divided, re-arranged, omitted, eliminated and/or implemented in any other way. Further the input 602, the code collector 604, the signature generator 606, the control logic 608, the database 610, the transmitter 612, and/or, more generally, the example meter 202 of FIG. 6 may be implemented by hardware, software, firmware and/or any combination of hardware, software and/or firmware. Thus, for example, any of the example input 602, the code collector 604, the signature generator 606, the control logic 608, the database 610, the transmitter 612, and/or, more generally, the example meter 202 of FIG. 6 could be implemented by one or more circuit(s), programmable processor(s), ASIC(s), PLD(s) and/or FPLD(s), etc. When any of the apparatus or system claims of this patent are read to cover a purely software and/or firmware implementation, at least one of the example input 602, the code collector 604, the signature generator 606, the control logic 608, the database 610, the transmitter 612, and/or the meter 202 are hereby expressly defined to include a tangible computer readable medium such as a memory, DVD, CD, etc. storing the software and/or firmware. Further still, the example meter 202 of FIG. 6 may include one or more elements, processes and/or devices in addition to, or instead of, those illustrated in FIG. 6, and/or may include more than one of any or all of the illustrated elements, processes and devices.

Flowcharts representative of example machine readable instructions for implementing example USB data monitors 102 of FIGS. 3-5 are shown in FIGS. 7-10. In these examples, the machine readable instructions comprise a program for execution by a processor such as the processor 1212 shown in the example processor platform 1200 discussed below in connection with FIG. 12. The program may be embodied in software stored on a tangible computer readable medium such as a compact disc read-only memory ("CD-ROM"), a floppy disk, a hard drive, a DVD, or a memory associated with the processor 1212, but the entire program and/or parts thereof could alternatively be executed by a device other than the processor 1212 and/or embodied in firmware or dedicated hardware. Further, although the example program is described with reference to the flowcharts illustrated in FIGS. 7-10, many other methods of implementing the example USB data monitor 102 may alternatively be used. For example, the order of execution of the blocks may be changed, and/or some of the blocks described may be changed, eliminated, or combined.

As mentioned above, the example processes of FIGS. 7-10 may be implemented using coded instructions (e.g., computer readable instructions) stored on a tangible computer readable medium such as a hard disk drive, a flash memory, a read-only memory ("ROM"), a CD, a DVD, a cache, a random-access memory ("RAM") and/or any other storage media in which information is stored for any duration (e.g., for extended time periods, permanently, brief instances, for temporarily buffering, and/or for caching of the information). As used herein, the term tangible computer readable medium is expressly defined to include any type of computer readable storage and to exclude propagating signals. Additionally or alternatively, the example processes of FIGS. 7-10 may be implemented using coded instructions (e.g., computer readable instructions) stored on a non-transitory computer readable medium such as a hard disk drive, a flash memory, a read-only memory, a compact disk, a digital versatile disk, a cache, a random-access memory and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals. As used herein, when the phrase "at least" is used as the transition term in a preamble of a claim, it is open-ended in the same manner as the term "comprising" is open ended. Thus, a claim using "at least" as the transition term in its preamble may include elements in addition to those expressly recited in the claim.

Figure 7:
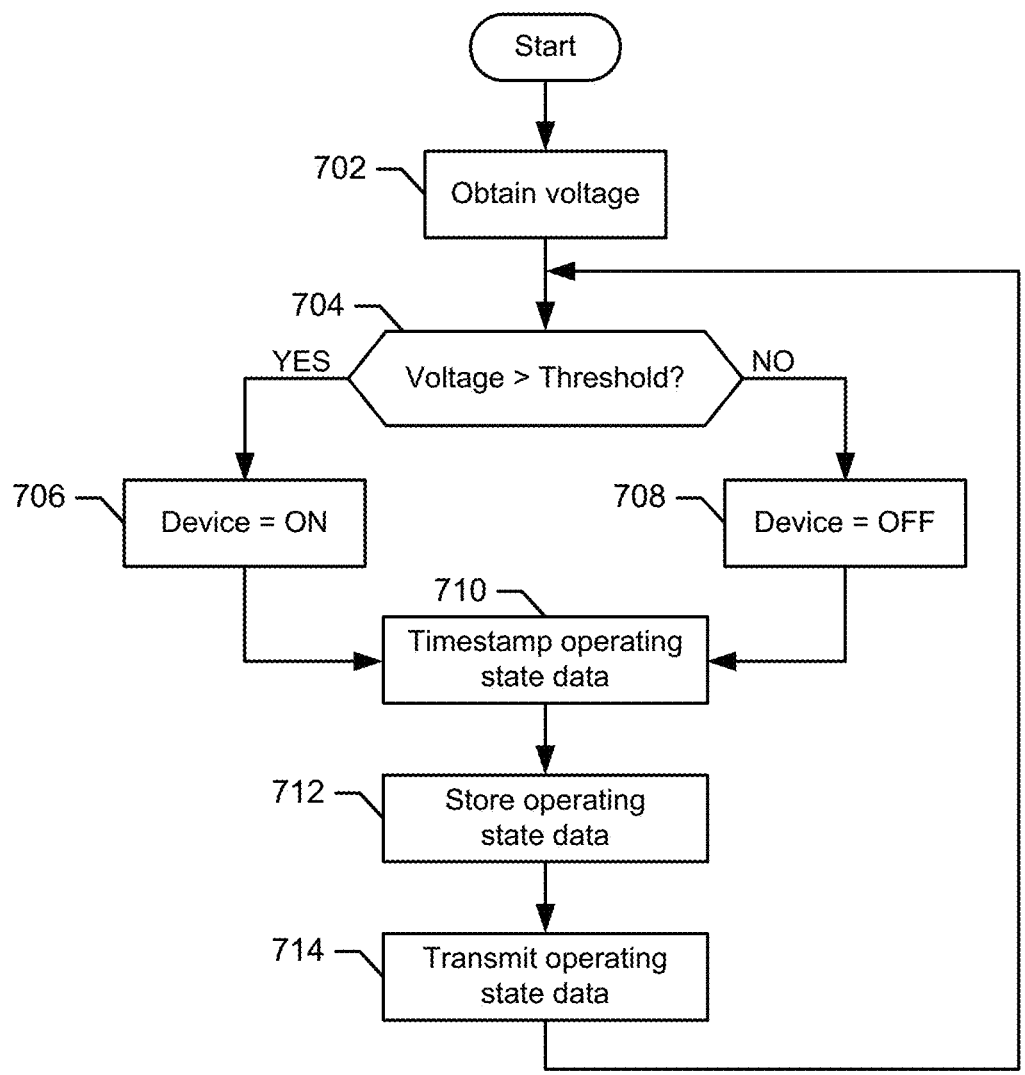
FIGS. 7-10 are flow diagrams representative of example machine readable instructions that may be executed to implement the example USB data monitors of FIGS. 3-5.

FIG. 7 is a flow diagram representative of example machine readable instructions that may be executed to implement the example USB data monitor 102 of FIG. 3. The USB data monitor 102 of the illustrated example is used to determine an operating state of a media presentation device, such as the media presentation device 104. The operating state of the media presentation device 104 is useful in the context of home audience measurement for example, to allow an audience measurement company to decide whether to credit audience exposure to media.

Initially, the voltage input 304 of the illustrated example obtains a voltage output by the USB port 106 of the media presentation device 104 (block 702). The voltage input 304 of the illustrated example obtains the voltage on the power pins of the USB port 106. The voltage comparator 306 of the illustrated example compares the detected voltage at the USB port 106 to the voltage threshold 308 (block 704). If the detected voltage exceeds the voltage threshold 308, the voltage comparator 306 of the illustrated example determines the media presentation device 104 is in an on state (block 706). If the detected voltage does not exceed the voltage threshold 308, the voltage comparator 306 of the illustrated example determines the media presentation device is in an off state (block 708).

The voltage comparator 306 of the illustrated example sends operating state data representative of whether the media presentation device 104 is in an on state or in an off state (e.g., a bit set high to indicate an on state and/or a bit set low to indicate an off state) to the timestamper 310. The timestamper 310 of the illustrated example timestamps the operating state data (block 710) and sends the timestamped operating state data to the database 312. The database 312 of the illustrated example stores the timestamped operating state data (block 712) and sends the timestamped operating state data to the transmitter 314. The transmitter 314 of the illustrated example transmits the operating state data to, for example, a central facility (e.g., the central facility 108 of FIG. 1) (block 714). In some examples, the transmitter 314 transmits the operating state data to a meter, such as the meter 202 of FIG. 2, and/or the timestamping is not performed at the USB data monitor 102. Control then returns to block 704 when the instructions are completed.

Figure 8:
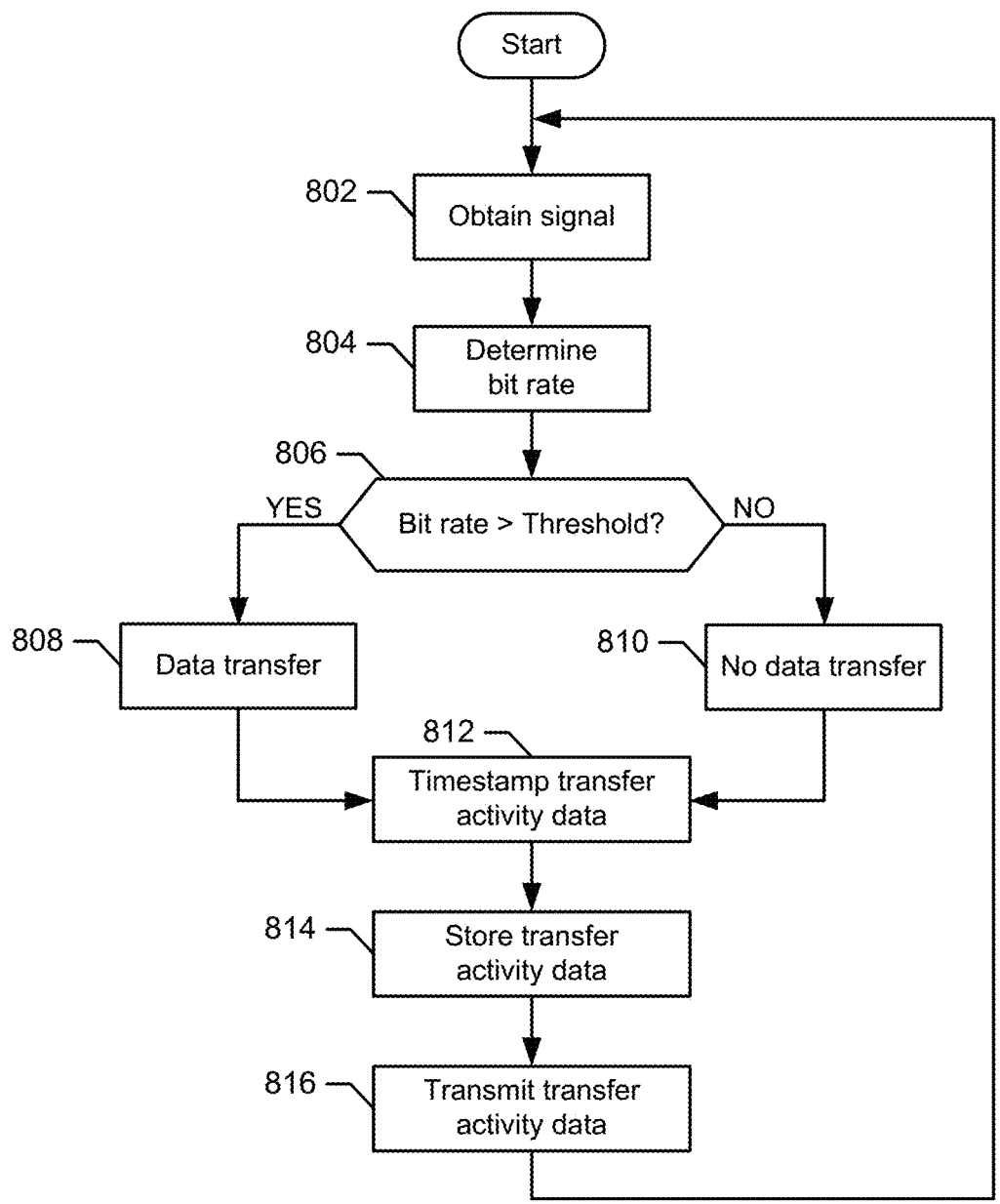

FIG. 8 is a flow diagram representative of example machine readable instructions that may be executed to implement the example USB data monitor 102 of FIG. 4. The USB data monitor 102 of the illustrated example is used to detect an occurrence of a data transfer at a media presentation device, such as the media presentation device 104.

Figure 10:
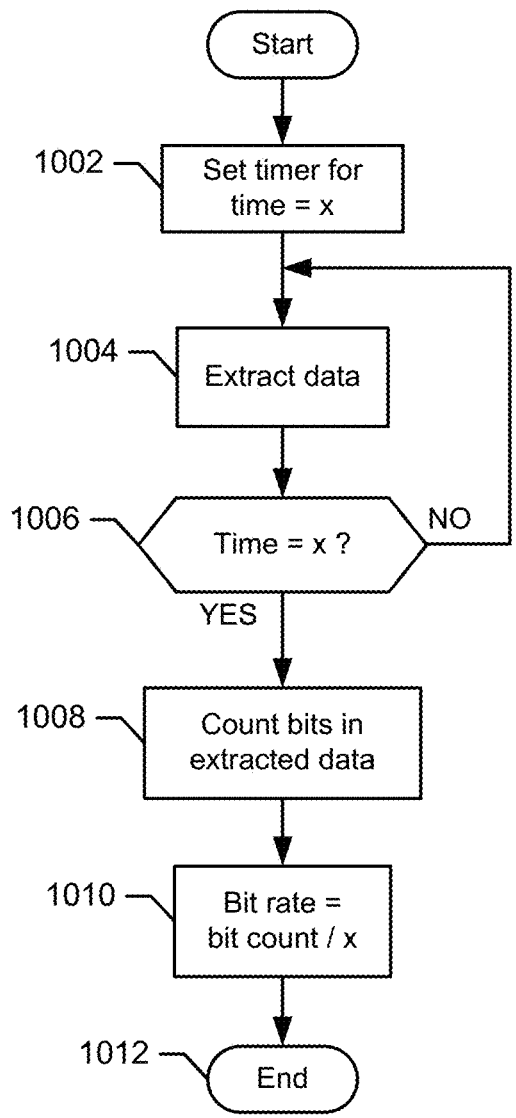

Initially, the data input 402 of the illustrated example obtains a signal at the USB port 106 of the media presentation device 104 (block 802). The data input 402 of the illustrated example obtains the signal at the data pins of the USB port 106. The bit rate comparator 404 of the illustrated example determines a bit rate of the signal obtained from the data input 402 (block 804). Example machine readable instructions that may be executed to determine the bit rate of the signal are illustrated in FIG. 10 and described in detail below. The bit rate comparator 404 of the illustrated example compares the determined bit rate of the signal to the threshold bit rate 408 (block 806). If the bit rate exceeds the threshold 408, the bit rate comparator 404 of the illustrated example determines the media presentation device 104 is involved in a data transfer (block 808). If the bit rate does not exceed the threshold 408, the bit rate comparator 404 of the illustrated example determines the media presentation device 104 is not involved in a data transfer (block 810).

The bit rate comparator 404 of the illustrated example passes transfer activity data indicative of whether the media presentation device 104 is involved in a data transfer (e.g., a bit set high to indicate a data transfer and/or a bit set low to indicate no data transfer) to the timestamper 310. The timestamper 310 of the illustrated example timestamps the transfer activity data (block 812) and sends the transfer activity data to the database 312. The database 312 of the illustrated example stores the transfer activity data (block 814) and sends the transfer activity data to the transmitter 314. The transmitter 314 of the illustrated example transmits the transfer activity data to, for example, a central facility (e.g., the central facility 108 of FIG. 1) (block 816). In some examples, the transmitter 314 transmits the transfer activity data to a meter, for example the meter 202 of FIG. 2, and/or timestamping is not performed at the USB data monitor 102. Control then returns to block 802 when the instructions are completed.

Figure 9:
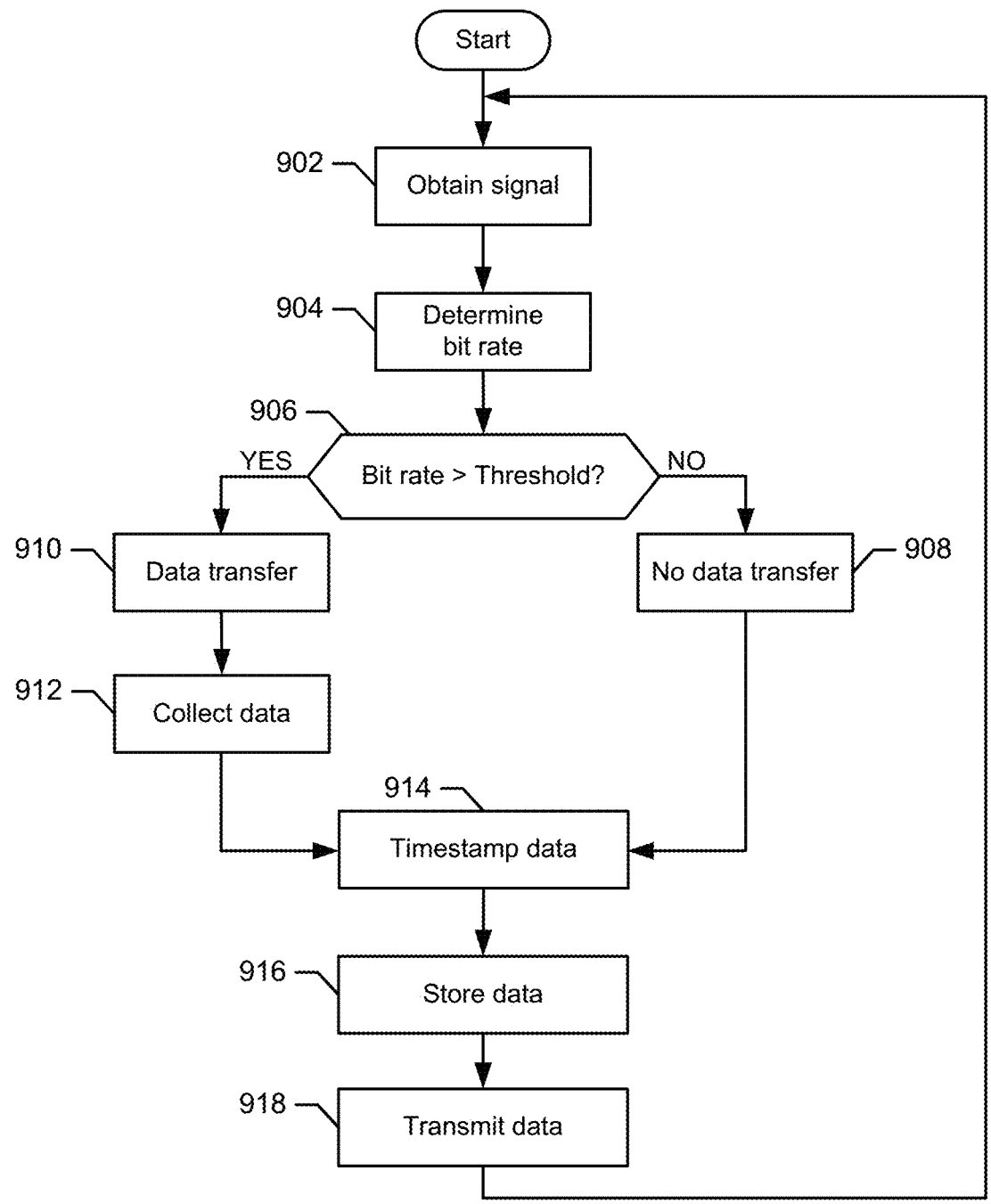

FIG. 9 is a flow diagram representative of example machine readable instructions that may be executed to implement the example USB data monitor 102 of FIG. 5. The USB data monitor 102 of the illustrated example is used to detect an occurrence of a data transfer at a media presentation device, such as the media presentation device 104. The USB data monitor 102 of the illustrated example is also used to collect data from a signal at the USB port 106 of the media presentation device 104. Determining if the media presentation device 104 is involved in a data transfer and/or collecting data from the signal is useful in the context of home audience measurement for example, to allow for additional analysis of audience measurement data.

Initially, the data input 402 of the illustrated example obtains a signal at the USB port 106 of the media presentation device 104 (block 902). The data input 402 of the illustrated example obtains the signal at the data pins of the USB port 106. The bit rate comparator 404 of the illustrated example determines a bit rate of the signal obtained from the data input 402 (block 904). Example machine readable instructions that may be executed to determine the bit rate of the signal are illustrated in FIG. 10 and described below.

The bit rate comparator 404 of the illustrated example compares the determined bit rate of the signal to the threshold bit rate 408 (block 906). If the bit rate does not exceed the threshold 408, the bit rate comparator 404 of the illustrated example determines the media presentation device 104 is not involved in a data transfer (block 908). If the bit rate exceeds the threshold 408, the bit rate comparator 404 of the illustrated example determines the media presentation device 104 is involved in a data transfer (block 910). In the illustrated example, if the bit rate comparator 404 determines the media presentation device 104 is involved in a data transfer, the bit rate comparator 404 instructs the data collector 502 to collect (and/or retain previously collected data) data from the signal obtained by the data input 402. At block 912, the data collector 502 of the illustrated example collects data from the signal obtained by the data input 402 via the data pins at the USB port 106. Collected data may include, for example, a type of data transfer occurring, source information, a payload, a code, metadata, a signature, and/or the audio signal itself. In some examples, the data collector 502 collects data continuously without being triggered by an occurrence of a data transfer.

The bit rate comparator 404 of the illustrated example passes transfer activity data indicative of whether the media presentation device is involved in a data transfer (e.g., a bit set high to indicate a data transfer and/or a bit set low to indicate no data transfer) to the timestamper 310. The data collector 502 of the illustrated example passes collected data to the timestamper 310. The timestamper 310 of the illustrated example timestamps the transfer activity data and/or the collected data (block 914) and sends the transfer activity data and/or the collected data to the database 312. The database 312 of the illustrated example stores the transfer activity data and/or the collected data (block 916) and sends the transfer activity data and/or the collected data to the transmitter 314. The transmitter 314 of the illustrated example transmits the transfer activity data and/or the collected data to, for example, a central facility (e.g., the central facility 108 of FIG. 1) (block 918). In some examples, the transmitter 314 transmits the transfer activity data and/or the collected data to a meter, for example the meter 202 of FIG. 2, and/or timestamping is not performed at the USB monitor 102. Control then returns to block 902 when the instructions are completed.

FIG. 10 is a flow diagram representative of example machine readable instructions that may be executed to determine a bit rate of a signal obtained at the USB port 106 of the media presentation device 104. The instructions of the illustrated example are used to implement the example USB data monitor 102 of FIGS. 4-5.

Initially, the bit rate comparator 404 of the illustrated example sets the timer 406 to a time interval (block 1002). The bit rate comparator 404 of the illustrated example extracts data from the signal obtained at the data input 402 via the USB port 106 (block 1004). The bit rate comparator 404 of the illustrated example uses the timer 406 to determine if the set time interval has been reached (block 1006). If the time interval has not been reached, control returns to block 1004 and the bit rate comparator 404 of the illustrated example continues to extract data from the signal. Once the time interval has been reached, the bit rate comparator 404 of the illustrated example counts the bits in the extracted data (block 1008). The bit rate comparator 404 of the illustrated example determines the bit rate of the signal by dividing the number of bits in the extracted data by the time interval (block 1010). At block 1012, the instructions are completed.

Figure 11:
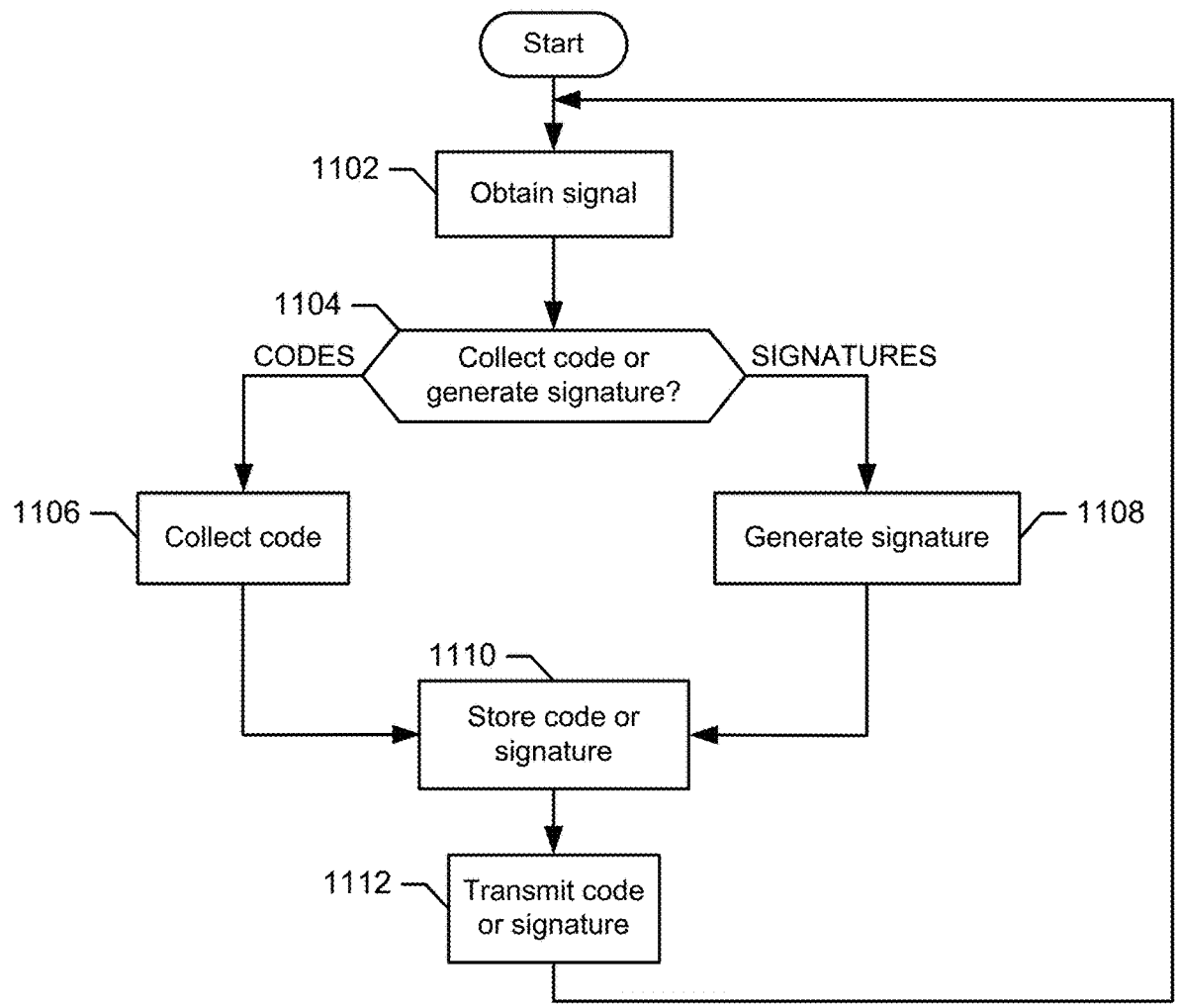
FIG. 11 is a flow diagram representative of example machine readable instructions that may be executed to implement the example meter of FIG. 6.

A flowchart representative of example machine readable instructions for implementing the example meter 202 of FIG. 6 is shown in FIG. 11. In this example, the machine readable instructions comprise a program for execution by a processor such as the processor 1212 shown in the example processor platform 1200 discussed below in connection with FIG. 12. The program may be embodied in software stored on a tangible computer readable medium such as a CD-ROM, a floppy disk, a hard drive, a DVD, or a memory associated with the processor 1212, but the entire program and/or parts thereof could alternatively be executed by a device other than the processor 1212 and/or embodied in firmware or dedicated hardware. Further, although the example program is described with reference to the flowchart illustrated in FIG. 11, many other methods of implementing the example meter 202 may alternatively be used. For example, the order of execution of the blocks may be changed, and/or some of the blocks described may be changed, eliminated, or combined.

As mentioned above, the example process of FIG. 11 may be implemented using coded instructions (e.g., computer readable instructions) stored on a tangible computer readable medium such as a hard disk drive, a flash memory, a ROM, a CD, a DVD, a cache, a RAM and/or any other storage media in which information is stored for any duration (e.g., for extended time periods, permanently, brief instances, for temporarily buffering, and/or for caching of the information). Additionally or alternatively, the example process of FIG. 11 may be implemented using coded instructions (e.g., computer readable instructions) stored on a non-transitory computer readable medium such as a hard disk drive, a flash memory, a ROM, a CD, a DVD, a cache, a RAM and/or any other storage media in which information is stored for any duration (e.g., for extended time periods, permanently, brief instances, for temporarily buffering, and/or for caching of the information).

FIG. 11 is a flow diagram representative of example machine readable instructions that may be executed to implement the example meter 202 of FIG. 6. The meter 202 of the illustrated example is used to collect, aggregate, locally process, and/or transfer data to a central data facility, such as the central data facility 112. In the illustrated example, the meter 202 is used to extract and/or analyze codes and/or signatures from data and/or signals collected by the example USB data monitor 102 and/or via other channels.

Initially, the input 602 of the illustrated example obtains a signal from the USB data monitor 102 or via another channel (e.g., from free field audio sampled by a microphone of the meter 202 for a different device, etc.) (block 1102). The control logic 608 of the illustrated example determines whether to collect a code or generate a signature from the signal obtained at the input 602 (block 1104). In the illustrated example, either a code is collected or a signature is generated from the signal. In other examples, both a code and a signature are collected and/or generated.

If a code is to be collected, the code collector 604 of the illustrated example collects a code from the signal obtained at the input 602 (block 1106). The code collector 604 of the illustrated example passes the collected code(s) to the database 610. If a signature is to be generated, the signature generator 606 generates a signature from the signal obtained at the input 602 (block 1108). The signature generator 606 of the illustrated example passes the generated signature(s) to the database 610. The database 610 of the illustrated example stores the collected codes and/or generated signatures (block 1110) and passes the codes and/or signatures to the transmitter 612. The transmitter 612 of the illustrated example transmits the collected codes and/or generated signatures to the central facility 112 via a network, such as the network 114. Control then returns to block 1102 when the instructions are completed.

Figure 12:
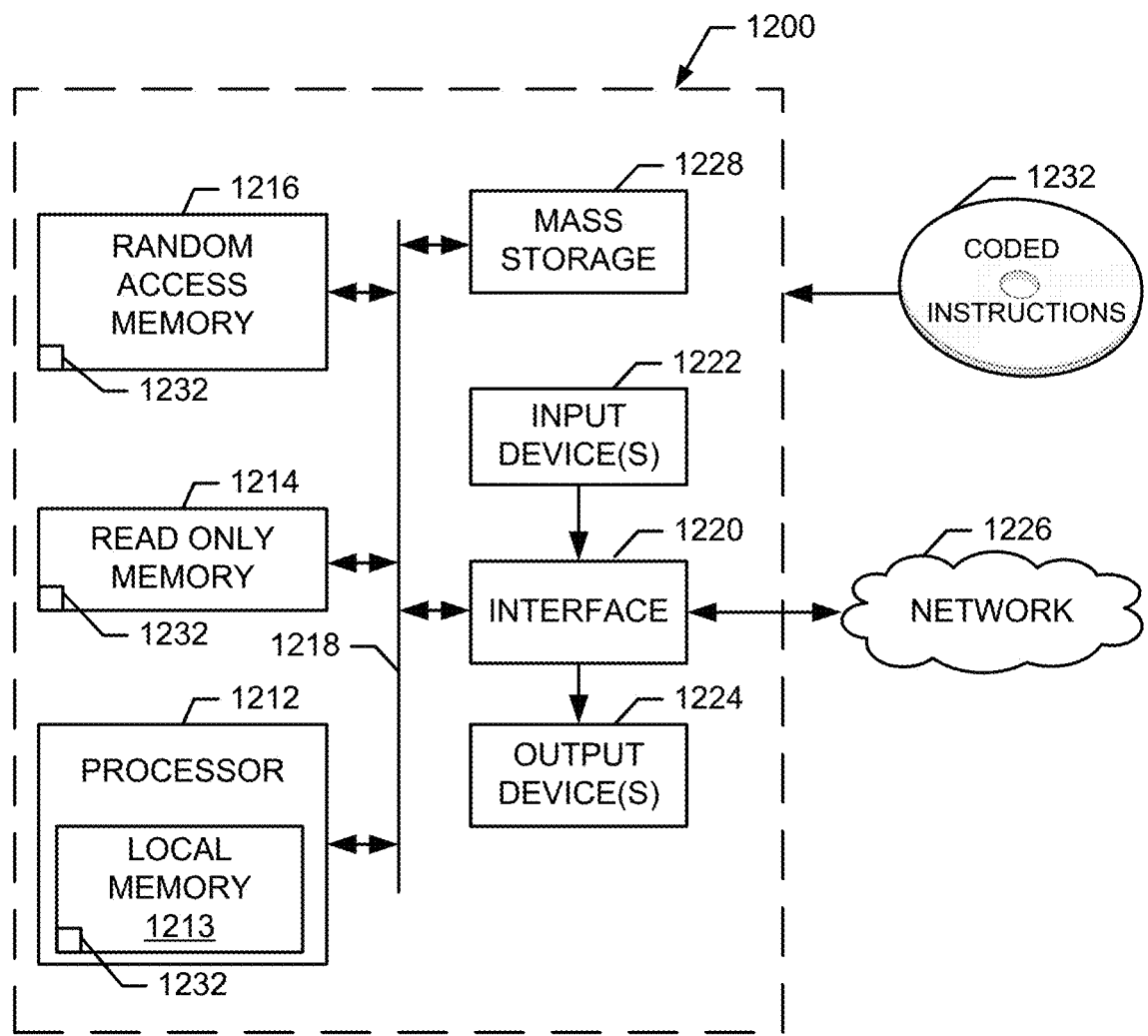
FIG. 12 is a block diagram of an example processor platform that may be used to execute the instructions of FIGS. 7-11 to implement the example USB data monitors of FIGS. 3-5, the example meter of FIG. 6, and/or, more generally, the example systems of FIGS. 1 and 2.

FIG. 12 is a block diagram of an example processor platform 1200 capable of executing the instructions of FIGS. 7, 8, 9, 10, and/or 11 to implement the example USB data monitor(s) 102 of FIGS. 3, 4, and/or 5, the example meter 202 of FIG. 6, and/or the systems of FIG. 1 or 2. The processor platform 1200 can be, for example, a server, a personal computer, an Internet appliance, a set top box, or any other type of computing device.

The system 1200 of the instant example includes a processor 1212. For example, the processor 1212 can be implemented by one or more microprocessors or controllers from any desired family or manufacturer.

The processor 1212 includes a local memory 1213 (e.g., a cache) and is in communication with a main memory including a volatile memory 1214 and a non-volatile memory 1216 via a bus 1218. The volatile memory 1214 may be implemented by Synchronous Dynamic Random Access Memory ("SDRAM"), Dynamic Random Access Memory ("DRAM"), RAMBUS Dynamic Random Access Memory ("RDRAM") and/or any other type of random access memory device. The non-volatile memory 1216 may be implemented by flash memory and/or any other desired type of memory device. Access to the main memory 1214, 1216 is controlled by a memory controller.

The processor platform 1200 also includes an interface circuit 1220. The interface circuit 1220 may be implemented by any type of interface standard, such as an Ethernet interface, a USB, and/or a PCI express interface.

One or more input devices 1222 are connected to the interface circuit 1220. The input device(s) 1222 permit a user to enter data and commands into the processor 1212. The input device(s) can be implemented by, for example, a keyboard, a mouse, a touchscreen, a track-pad, and/or a trackball.

One or more output devices 1224 are also connected to the interface circuit 1220. The output devices 1224 can be implemented, for example, by display devices (e.g., a liquid crystal display, a cathode ray tube display ("CRT"), a printer and/or speakers). The interface circuit 1220, thus, typically includes a graphics driver card.

The interface circuit 1220 also includes a communication device such as a modem or network interface card to facilitate exchange of data with external computers via a network 1226 (e.g., an Ethernet connection, a DSL, a telephone line, coaxial cable, a cellular telephone system, etc.).

The processor platform 1200 also includes one or more mass storage devices 1228 for storing software and data. Examples of such mass storage devices 1228 include floppy disk drives, hard drive disks, compact disk drives and DVD drives. The mass storage device 1228 may implement a local storage device.

The coded instructions 1232 of FIGS. 7, 8, 9, 10 and/or 11 may be stored in the mass storage device 1228, in the volatile memory 1214, in the non-volatile memory 1216, and/or on a removable storage medium such as a CD or DVD.

Although certain example methods, systems, apparatus, and articles of manufacture have been described herein, the scope of coverage of this patent is not limited thereto. On the contrary, this patent covers all methods, systems and articles of manufacture fairly falling within the scope of the claims of this patent.

What is claimed is:

1. An apparatus comprising:
a bit rate comparator to count a number of bits from a media presentation device input port communicatively connected to a media presentation device; and
a timer to:
begin a time interval in response to initiation by the bit rate comparator; and
indicate an end of the time interval, the bit rate comparator to determine a bit rate corresponding to the media presentation device input port based on the count of the number of bits during the time interval, the bit rate comparator to:
compare the bit rate to a threshold;
when the threshold is satisfied, credit an audience as exposed to media output from the media presentation device; and when the threshold is not satisfied, prevent crediting of the audience as exposed to the media output from the media presentation device.

2. The apparatus as defined in claim 1, further including a timestamper to:
- label operating state data corresponding to the media presentation device with an indication of an on-state when the threshold is satisfied; and
- label the operating state data corresponding to the media presentation device with an indication of an off-state when the threshold is not satisfied.

3. The apparatus as defined in claim 2, wherein the timestamper is to transmit the operating state data to at least one of a media meter or a data collection facility.

4. The apparatus as defined in claim 1, further including a pass through universal serial bus (USB) port communicatively connected to an external media device.

5. The apparatus as defined in claim 4, wherein the external media device includes at least one of a set top box or a DVD player.

6. The apparatus as defined in claim 1, wherein the bit rate comparator is to detect a type of data transfer corresponding to the media presentation device input port.

7. The apparatus as defined in claim 6, wherein the type of data transfer includes at least one of media source information, payload information, media identification information, station identification information, metadata or media signature information.

8. A non-transitory computer-readable medium comprising instructions that, when executed, cause at least one computing device to at least:
- count a number of bits from a media presentation device input port communicatively connected to a media presentation device;
- begin a time interval in response to initiation by a comparator;
- indicate an end of the time interval;
- determine a bit rate corresponding to the media presentation device input port based on the count of the number of bits during the time interval;
- compare the bit rate to a threshold;
- when the threshold is satisfied, credit an audience as exposed to media output from the media presentation device; and
- when the threshold is not satisfied, prevent crediting of the audience as exposed to the media output from the media presentation device.

9. The computer-readable medium as defined in claim 8, wherein the instructions, when executed, cause the at least one computing device to:
- label operating state data corresponding to the media presentation device with an indication of an on-state when the threshold is satisfied; and
- label the operating state data corresponding to the media presentation device with an indication of an off-state when the threshold is not satisfied.

10. The computer-readable medium as defined in claim 9, wherein the instructions, when executed, cause the at least one computing device to transmit the operating state data to at least one of a media meter or a data collection facility.

11. The computer-readable medium as defined in claim 8, wherein the instructions, when executed, cause the at least one computing device to pass data from an external media device via a universal serial bus (USB) port.

12. The computer-readable medium as defined in claim 11, wherein the external media device includes at least one of a set top box or a DVD player.

13. The computer-readable medium as defined in claim 8, wherein the instructions, when executed, cause the at least one computing device to detect a type of data transfer corresponding to the media presentation device input port.

14. The computer-readable medium as defined in claim 13, wherein the type of data transfer includes at least one of media source information, payload information, media identification information, station identification information, metadata or media signature information.

15. A method to control crediting of a media source device, the method comprising:
- counting a number of bits from a media presentation device input port communicatively connected to a media presentation device;
- beginning a time interval in response to initiation by a comparator;
- indicating an end of the time interval;
- determining a bit rate corresponding to the media presentation device input port based on the count of the number of bits during the time interval;
- comparing the bit rate to a threshold;
- when the threshold is satisfied, crediting an audience as exposed to media output from the media presentation device; and
- when the threshold is not satisfied, preventing crediting of the audience as exposed to the media output from the media presentation device.

16. The method as defined in claim 15, further including:
- labeling operating state data corresponding to the media presentation device with an indication of an on-state when the threshold is satisfied; and
- labeling the operating state data corresponding to the media presentation device with an indication of an off-state when the threshold is not satisfied.

17. A system to control crediting of a media source device, the system comprising:
- means for bit counting to count a number of bits from a media presentation device input port communicatively connected to a media presentation device; and
- means for controlling a time interval to:
  - begin the time interval in response to initiation by the bit counting means; and
  - indicate an end of the time interval,
- the bit counting means to:
  - determine a bit rate corresponding to the media presentation device input port based on the count of the number of bits during the time interval;
  - compare the bit rate to a threshold;
  - when the threshold is satisfied, credit an audience as exposed to media output from the media presentation device; and
  - when the threshold is not satisfied, prevent crediting of the audience as exposed to the media output from the media presentation device.

18. The system as defined in claim 17, further including means for timestamping to:
- label operating state data corresponding to the media presentation device with an indication of an on-state when the threshold is satisfied; and
- label the operating state data corresponding to the media presentation device with an indication of an off-state when the threshold is not satisfied.

19. The system as defined in claim 18, wherein the timestamping means is to transmit the operating state data to at least one of a media meter or a data collection facility.

20. The system as defined in claim 17, wherein the system includes a pass through universal serial bus (USB) port communicatively connected to an external media device.

\* \* \* \* \*